United States Patent
Pratt et al.

(10) Patent No.: US 8,463,207 B2
(45) Date of Patent: Jun. 11, 2013

(54) WIRELESS COMMUNICATION UNIT, INTEGRATED CIRCUIT AND METHOD OF POWER CONTROL OF A POWER AMPLIFIER THEREFOR

(75) Inventors: Patrick Pratt, Mallow (IE); George Norris, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 72 days.

(21) Appl. No.: 13/058,025

(22) PCT Filed: Aug. 20, 2008

(86) PCT No.: PCT/IB2008/053324
§ 371 (c)(1),
(2), (4) Date: Feb. 8, 2011

(87) PCT Pub. No.: WO2010/020833
PCT Pub. Date: Feb. 25, 2010

(65) Prior Publication Data
US 2011/0136452 A1    Jun. 9, 2011

(51) Int. Cl.
    *H04B 1/04* (2006.01)
(52) U.S. Cl.
    USPC .................. 455/126; 455/91; 455/127.2
(58) Field of Classification Search
    USPC ............ 455/91, 114.2, 114.3, 115.1, 127.1, 455/127.2, 127.3, 126; 330/127, 129, 149
    See application file for complete search history.

(56) References Cited

U.S. PATENT DOCUMENTS

| | | | |
|---|---|---|---|
| 5,196,808 A | 3/1993 | Pickett et al. | |
| 5,245,297 A * | 9/1993 | Claydon et al. | 330/129 |
| 5,675,286 A * | 10/1997 | Baker et al. | 330/129 |
| 6,160,449 A | 12/2000 | Klomsdorf et al. | |
| 6,211,733 B1 | 4/2001 | Gentzler | |
| 6,617,920 B2 * | 9/2003 | Staudinger et al. | 330/149 |
| 6,628,165 B1 * | 9/2003 | Henderson et al. | 330/85 |
| 6,798,843 B1 | 9/2004 | Wright et al. | |
| 7,058,369 B1 | 6/2006 | Wright et al. | |
| 7,203,247 B2 | 4/2007 | Bauder | |
| 7,251,293 B2 | 7/2007 | Vella-Coleiro | |
| 7,570,928 B2 * | 8/2009 | Magoon et al. | 455/102 |
| 7,634,240 B2 * | 12/2009 | Mitzlaff et al. | 455/127.3 |

(Continued)

FOREIGN PATENT DOCUMENTS

| | | |
|---|---|---|
| EP | 1 681 771 A1 | 7/2006 |
| WO | 01/05026 A1 | 1/2001 |
| WO | 2010035065 A1 | 4/2010 |

OTHER PUBLICATIONS

Sahu Biranchinath et al: "A High-Efficiency Linear RF Power Amplifier With a Power-Tracking Dynamically Adaptive Buck-Boost Supply" IEEE Transactions on Microwave Theory and Techniques, vol. 52, No. 1, Jan. 2004 pp. 112-120.

(Continued)

*Primary Examiner* — Sonny Trinh

(57) ABSTRACT

A wireless communication unit comprising a transmitter having a power amplifier, a controller logic module arranged to control a power control value of the power amplifier and a closed loop control system operably coupled to the power amplifier and arranged to monitor a level of peak PA compression, wherein in response to the identified level of peak PA compression the controller logic module is arranged to automatically adjust a power amplifier power control value of the PA to obtain a predetermined level of peak PA compression.

20 Claims, 6 Drawing Sheets

U.S. PATENT DOCUMENTS

| | | | |
|---|---|---|---|
| 7,904,045 B2 * | 3/2011 | Aoki et al. | 455/260 |
| 8,213,880 B2 | 7/2012 | van Zelm et al. | |
| 8,243,852 B1 | 8/2012 | Summerfield | |
| 8,301,090 B2 | 10/2012 | Brown et al. | |
| 2007/0287393 A1 | 12/2007 | Nandipaku et al. | |
| 2008/0032634 A1 | 2/2008 | Magoon et al. | |
| 2008/0243899 A1 | 10/2008 | Staudinger et al. | |
| 2008/0298500 A1 | 12/2008 | Norris et al. | |
| 2009/0111399 A1 | 4/2009 | Norris et al. | |

OTHER PUBLICATIONS

Hanington Gary et al: "High-Efficiency Power Amplifier Using Dynamic Power-Supply Voltage for CDMA Applications" IEEE Transactions on Microwave Theory and Techniques, vol. 47, No. 8, Aug. 1999, pp. 1471-1476.

International Search Report and Written Opinion correlating to PCT/IB2008/053324 dated Jul. 6, 2009.

International Search Report mailed May 7, 2009 for International Application No. PCT/IB2008/053875, 3 pages.

Faulkner, M. et al., "Adaptive Linearization Using Predistortion—Experimental Results," IEEE Transactions on Vehicular Technology, vol. 43, No. 2, May 1994, pp. 323-332.

Notice of Allowance mailed Jan. 3, 2013 for U.S. Appl. No. 13/120,519, 13 pages.

* cited by examiner

Saturation Detect & Correct

WIRELESS COMMUNICATION UNIT, INTEGRATED CIRCUIT AND METHOD OF POWER CONTROL OF A POWER AMPLIFIER THEREFOR

TECHNICAL FIELD

The technical field relates generally to a wireless communication unit, integrated circuit and method of power control of a power amplifier therefor. The technical field is applicable to, but not limited to, a wireless communication unit, integrated circuit and method of radio frequency digital tracking to bias a power amplifier.

BACKGROUND

Wireless communication systems, for example cellular telephony or private mobile radio communication systems, typically provide for radio telecommunication links to be arranged between a plurality of base transceiver stations (BTS), referred to as Node Bs with regard to a universal mobile telecommunication system (UMTS), and a plurality of subscriber units, often referred to as user equipment (UE) in UMTS.

In a cellular network, such as UMTS, the power transmitted by a UE is regulated in order to minimise interference with other UEs. Typically, the output power generated by the radio frequency (RF) power amplifier (PA) in the UE will vary due to any number, or combination, of factors, such as the manufacturing process, operating temperature, supply voltage, antenna loading and other such factors. Thus, it often becomes necessary to measure the radio frequency transmit power at, or after, the PA output and to control a PA gain, typically by controlling the gain of amplifiers located earlier in the amplifier chain, in response to this measurement. This feedback will allow power control regulation to compensate for variations in PA supply voltage, operating temperature & manufacturing process.

Continuing pressure on the limited spectrum available for radio communication systems is forcing the development of spectrally-efficient linear modulation schemes. Since the envelopes of a number of these linear modulation schemes fluctuate, intermodulation products can be generated in the non-linear radio frequency power amplifier. Thus, it is important to ensure any unwanted terms arising from the intermodulation are minimised and stay below a specified value. By modifying the bias to improve efficiency the PA becomes more non-linear, which in turn would lead to increased intermodulation problems. Specifically, in this field, there has been a significant amount of research effort in developing high efficiency topologies capable of providing high performances in the 'back-off' (linear) region of the power amplifier.

Linear modulation schemes require linear amplification of the modulated signal in order to minimise undesired out-of-band emissions. It is also known that non-linearities may also create in-band distortion, which is typically measured by determining an error vector magnitude (EVM). Quantum processes within a typical RF amplifying device are inherently non-linear by nature. Only when a small portion of the consumed DC power is transformed into RF power, can the transfer function of the amplifying device be approximated by a straight line, i.e. as in an ideal linear amplifier case. This mode of operation provides a low efficiency of DC to RF power conversion, which is unacceptable for portable (subscriber) wireless communication units. Furthermore, the low efficiency is also recognised as being problematic for the base stations.

Furthermore, the emphasis in portable (subscriber) equipment is to increase battery life. The emphasis for base station designers is to reduce operating and equipment cost (power consumption, size, power dissipation, etc.). Hence, such operating efficiencies of the amplifiers used must be maximised. To achieve both linearity and efficiency, so called linearisation techniques are used to improve the linearity of the more efficient amplifier classes, for example class 'AB', 'B' or 'C' amplifiers. A number of linearising techniques exist, such as Cartesian Feedback, Feed-forward, and Adaptive Pre-distortion (APD) and these are often used to resolve the inherent trade off of linearity versus efficiency in wireless communication units.

To fully exploit the advantages of APD, a system that will automatically adjust the power amplifier (PA) supply is also required, so that it may be optimally biased across, say, the 3GPP power target range as well as in the presence of process, temperature and/or load variation. It is known that without such a power tracking or Envelope Tracking (ET) system the PA can become over-compressed, resulting in a poor adjacent channel leakage power ratio (ACLR) and/or error vector magnitude (EVM) failure. Alternatively, the PA may be under-compressed resulting in reduced efficiency performance.

Known techniques using APD have been targeted at base station applications where the requirements on optimally biasing the PA across load and power target variation are less severe compared to a handset wireless communication design.

Furthermore, known techniques that use ET are invariably analogue-based, which is somewhat incompatible with the trend towards digital-based solutions, as used in APD. For example, the document titled 'A High-Efficiency Linear RF Power Amplifier with a Power-Tracking Dynamically Adaptive Buck-Boost Supply' authored by Sahu et al., and published in IEEE Trans MTT vol. 52, no 1 Jan. 2004 and the document titled 'High Efficiency Power Amplifier Using Dynamic Power-Supply Voltage for CDMA Applications', authored by Hannington et al., and published in IEEE Trans on MTT vol. 47 no 8 Aug. 2000 are typical examples of an analogue-RF precision solution to power tracking.

SUMMARY OF THE INVENTION

A wireless communication unit, an integrated circuit and a method of performing power control in a transmitter are described, as defined in the accompanying Claims.

Specific embodiments of the invention are set forth in the dependent claims. These and other aspects of the invention will be apparent from and elucidated with reference to the embodiments described hereinafter

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate, by way of example only, various embodiments and to explain various principles and advantages all in accordance with the invention.

DESCRIPTION OF EMBODIMENTS OF THE INVENTION

Figure 1:
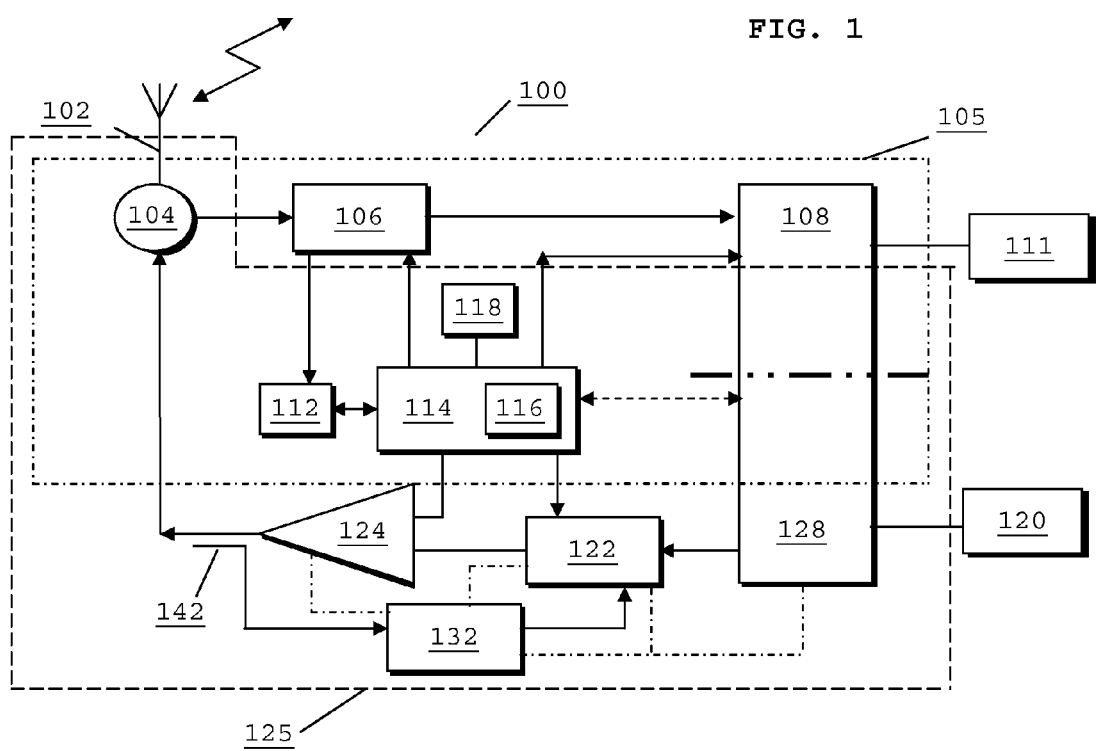
FIG. 1 illustrates a block diagram of an example of a wireless communication unit in accordance with an embodiment of the invention.

Because the illustrated examples of the present invention may, for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Referring to FIGS. 1-3 and 4, a closed loop control system that automatically adjusts a PA power supply (or PA bias voltage) to optimise linearity versus efficiency in the presence of process, temperature and/or load variation is shown. The closed loop control system may be arranged to monitor a level of peak PA compression by either naturally occurring or artificially inserted peaks. For instance, the peak response may be compared to a desired peak response, and the PA power supply may be adjusted so the peak response is regulated towards that desired.

For instance, the closed loop digital system may be arranged to regulate the amplitude modulation (AM) to AM PA distortion. In this embodiment a pulse insertion system is described that is arranged to measure peak compression AM to AM levels and compare the measured AM to AM value with a reference compression. In this manner, the pulse insertion system may ensure PA compression at a maximum peak to average power ratio (PAR) is continually monitored and the closed loop adjusted for optimal level of compression. For instance, the closed loop digital system may be applied in a transmitter arranged to support adaptive pre-distortion (APD) and employing a power tracking system. In this manner, it is possible to bias the PA relatively deeper into compression and hence improve on efficiency.

Furthermore, a peak detector system is shown that is arranged to detect a peak event or a maximum compression of a PA.

An adaptive slope adaptation may be employed to exploit a linear relationship between a desired output target voltage (in RMS) and a measured output voltage Vo(rms). Once the desired output target voltage (in RMS) and the measured output voltage Vo(rms) have converged, the closed loop system can be turned off and the final state of the slope used for setting the optimally Vcc voltage, given a target Vo(rms). It is noteworthy that Vo(rms) and Vo(sat) are related; ideally the loop adjusts Vcc so that there is a desired back off (x dB) between Vo(sat) and Vo(rms); for example the rms or mean value is x dB below the saturation or hard compression point.

Also, a saturation detection and correction system is shown that is arranged to automatically limit a target power to prevent a 'hard saturation' back off of a target power, should a hard saturation event occur. The limiting of a target power may be based on a linear relationship between the output voltage Vo(rms) and supply voltage Vcc and use the aforementioned slope adaptation algorithm.

Generally speaking, the various shown examples provide a transmitter architecture that comprises a new arrangement and method for improving a power control value of a power amplifier. For instance, a mechanism is described for adjusting the PA supply voltage Vcc. However, it is envisaged that the same technique may be used to adjust a PA bias voltage. Thus, hereinafter reference to a PA supply voltage in the specification and claims is meant to encompass both of these examples.

Furthermore, the proposed transmitter architecture may solve a number of problems and/or provide a number of advantages over the known prior art.

Referring now to FIG. 1, a block diagram of an example of a wireless communication unit 100 is illustrated. For the sake of clarity, the wireless communication unit 100 is shown as divided into two distinct portions: a receiver chain 105 and a transmitter chain 125.

The wireless communication unit 100 contains an antenna 102. The antenna 102 is coupled to an antenna switch 104 that provides signal control of radio frequency (RF) signals in the wireless communication unit 100, as well as isolation between the receiver chain 105 and transmitter chain 125. The antenna switch 104 may be replaced with a duplex filter, for frequency duplex communication units.

For completeness, the receiver 105 of the wireless communication unit 100 will be briefly described. The receiver 105 includes a receiver front-end circuit 106 (effectively providing reception, filtering and intermediate or base-band frequency conversion). The front-end circuit 106 is serially coupled to a signal processing function (generally realised by at least one digital signal processor (DSP)) 108. An output from the at least one digital signal processor 108 is provided to a user interface 111, which in a receiving context may comprise a suitable output device, such as a display or a loudspeaker. A controller 114 is operably coupled to the front-end circuit 106. A memory device 116 stores a wide array of data, such as decoding/encoding functions and the like. A timer 118 is operably coupled to the controller 114 to control the timing of operations, namely the transmission or reception of time-dependent signals.

As regards the transmit chain 125, this includes an input device 120, such as a keypad, or microphone operably coupled to signal processing logic circuit 128 and transmitter/modulation circuitry 122 and an up-converter/power amplifier 124. It should be noted that the signal processing logic circuit 128 in the transmit chain may be implemented as distinct from the at least one digital signal processor 108 in the receive chain. Alternatively, a single processor may be used to implement processing of both transmit and receive signals, as shown in FIG. 1.

As described hereafter, the signal processing logic circuit 128, transmitter/modulation circuitry 122 and the up-converter/power amplifier 124 may be operationally responsive to the controller 114, with an output from the power amplifier 124 coupled to the antenna switch 104. A feedback circuit includes a detector (not shown) and down-converter 132, which together with the transmitter/modulation circuitry 122, power amplifier 124 and a directional coupler 142, forms a closed feedback loop.

Figure 2:
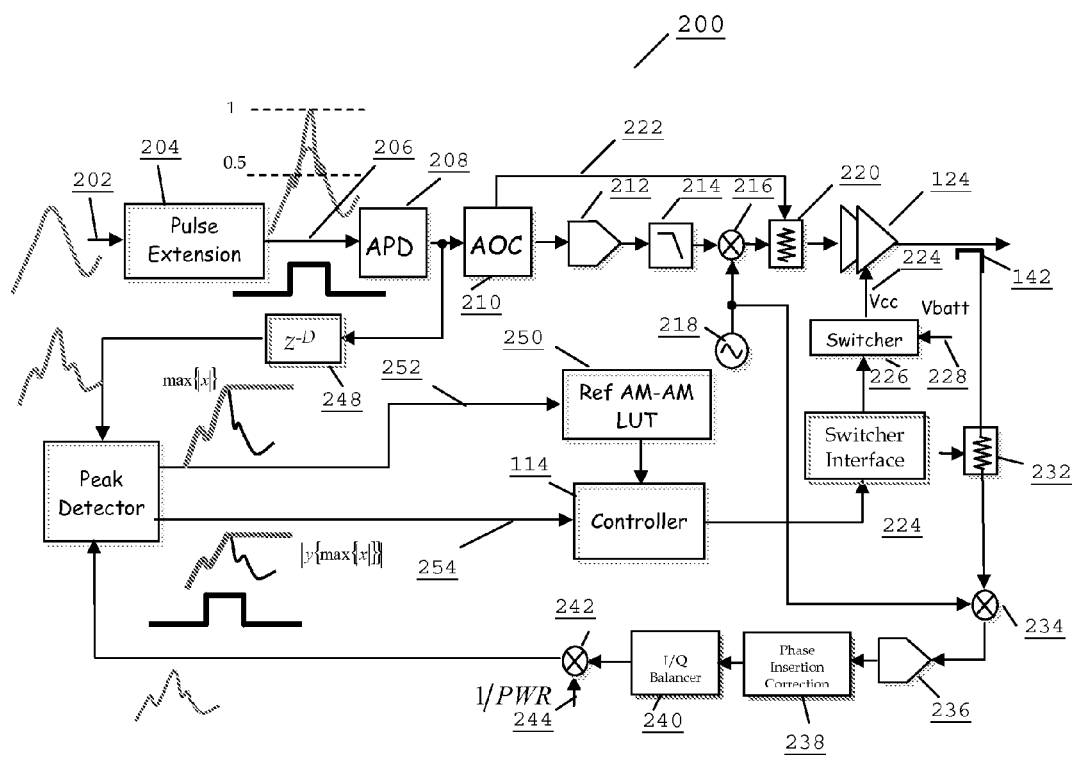
FIG. 2 illustrates a more detailed block diagram of an example of a transmitter of a wireless communication unit in accordance with embodiments of the invention.

Referring now to FIG. 2, an example of a transmitter architecture 200 is shown. The transmitter architecture 200 is adapted to measure peak compression and determine how the PA bias should be adjusted for the measured compression. The transmitter architecture 200 comprises a pulse amplitude extension logic module 204 arranged to extend an amplitude of an existing pulse 202. Thus, the pulse amplitude extension logic module 204 is arranged to detect when a naturally peak is going to happen and includes logic circuitry arranged to extend the peak to a desired value. E.g. the amplitude of the inserted pulse 202 is extended to ensure that the peak compression may be measured. The amplitude extended pulse 206 is input to an adaptive pre-distortion (APD) logic module 208. The APD logic module 208 provides a complex I/Q signal to an adaptive open-loop power control (AOC) logic module 210. The AOC logic module 210 inputs a scaled (i.e. multiplied) I/Q signal to a digital-to-analogue converter (DAC) 212, which converts the input digital signal to an analogue output signal. The DAC 212 outputs the analogue output signal to a low-pass filter (LPF) 214 that rejects undesired high frequency analogue signals. The output from the LPF 214 is input to an up-mixer arranged to frequency up-convert the analogue, filtered signal with a local oscillator (LO) 218 reference signal. The up-converted signal is input to a gain adjustment circuit 220, which is controlled by the AOC logic module 210. The gain adjusted signal is then input to a power amplifier chain 124, where it is amplified and routed to an antenna (not shown). A directional coupler 142 is arranged to couple a portion of the amplified transmit signal into a feedback path comprising a further gain adjustment circuit 232. The gain adjusted feedback signal is input to a down-mixer 234 arranged to frequency down-convert the coupled, gain-adjusted transmit signal with the LO 218 reference signal. The down-converted signal is input to an analogue-to-digital converter (ADC) 236, where it is converted to a digital form. The digital signal from the ADC 236 is then input to a phase insertion correction logic module 238.

The phase insertion correction logic module 238 corrects for phase distortions caused by the PA 124 in the following manner. If the system was perfectly linear, then the transmitted amplitude and phase (output from the PA 124) would be identical to the detected amplitude and phase (for example the detected output from the ADC 236). However, in practice the nonlinearity of the PA corrupts or distorts the amplitude modulated (AM) and phase modulated (PM) components of the original input signal. Thus, the purpose of the APD 208 is to predistort the transmit signal such that the detected AM and PM (as translated by ADC 236 (and represented at the output of the PA 124) is as close as possible to the original AM and PM components. In addition to the distortion of the PA corrupting the PM component of the output signal, the PA 124 will also introduce an arbitrary phase offset to the transmitted PM, which is generally known or referred to as Phase Insertion. The amount of phase insertion is a random function of temperature, voltage, loading, etc. The APD 208 attempts to correct for this. However, the correction performed by the APD 208 may cause instability if this offset correction is 'large'. Therefore, to avoid such instability occurring, the offset is subtracted out of the detected PM by the 'Insertion Phase Correction' logic module 238 under control of controller logic module 214 and APD logic module 208 (as known).

The output from the phase insertion correction logic module 238 is input to an I-Q balancer logic module 240 arranged to balance respective digital 'I' and 'Q' signals to ensure that they are separated by 90 degrees and have a relative gain of unity. The output from the I-Q balancer logic module 240 is input to a mixer/multiplier stage 242, where it is multiplied with a 1/PWR value 244. The multiplication with a 1/PWR value 24 allows the absolute scaling of the average Pout to be achieved. By selecting an appropriate value for the multiplication, it is possible to affect (via AOC operation) a desired average output power.

The output from the mixer/multiplier stage 242 is input to a peak detector logic module 246. The output from the APD logic module 208 is also input to a delay element 248 and thereafter the peak detector logic module 246. Thus, the peak detector logic module 246 measures the actual peak value of the input signal 202 and the output from the ADC 236. The peak detector logic module 246 provides two outputs, namely the peak AM input signal 252 and the corresponding AM detected output signal 254, to a reference amplitude modulation (AM) to AM look-up-table (LUT) 250 and a controller logic module 114. The controller logic module 214 also receives the desired output signal for the given peak AM input signal from the reference AM to AM look up table 250. The controller logic module 114 then controls the power supply input to the PA 224 via a switcher interface 230 and a switcher logic module 226 that also receives the battery supply voltage 228.

Figure 3:
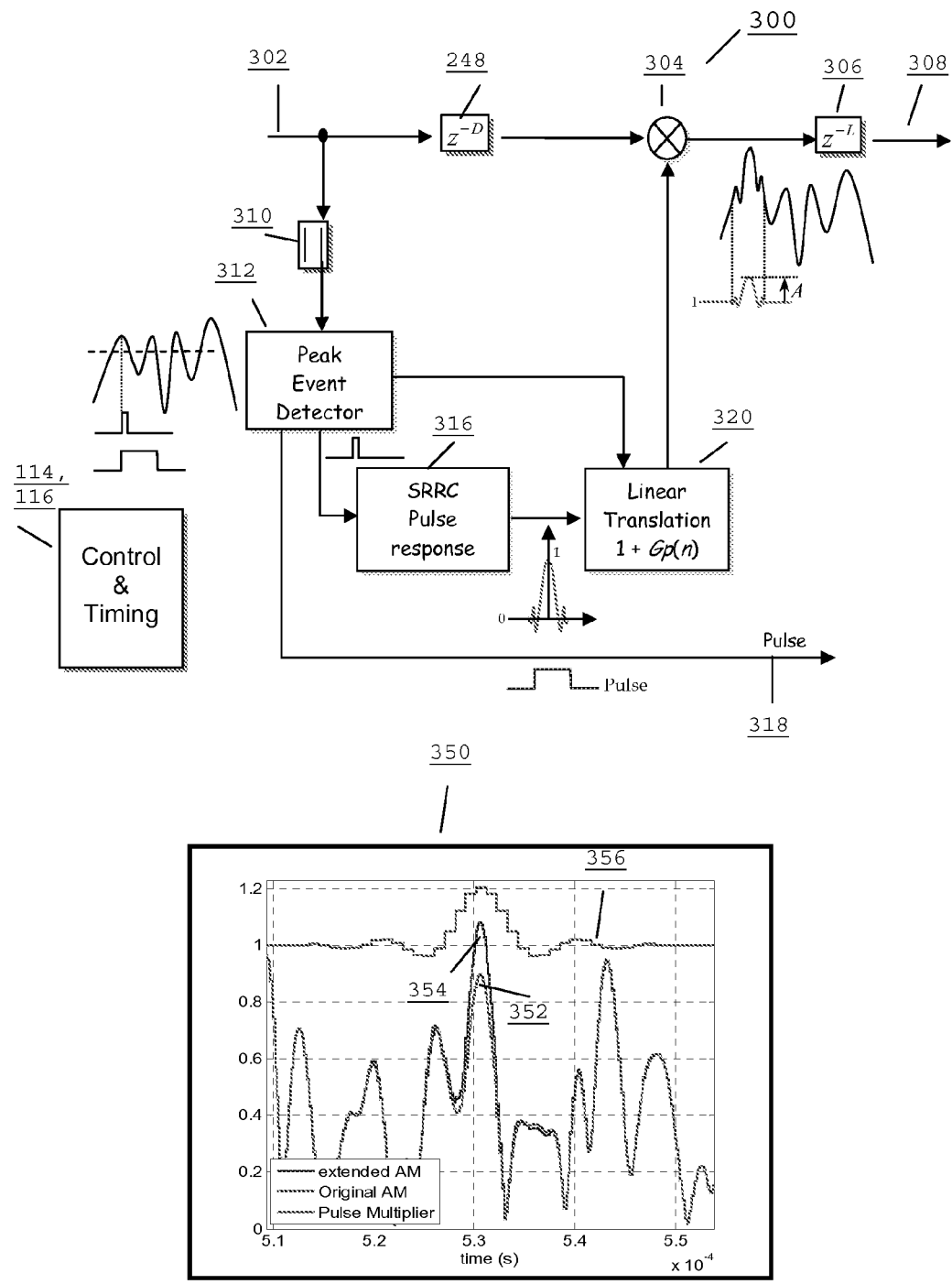
FIG. 3 illustrates a more detailed block diagram of an example of a pulse insertion system of a wireless communication unit transmitter in accordance with embodiments of the invention.

Referring now to FIG. 3, a more detailed block diagram of an example of a pulse insertion system of a wireless communication unit transmitter, such as pulse amplitude extension logic module 204 of FIG. 2, is illustrated. The pulse amplitude extension logic module 204 comprises an input signal 302 that is input to a magnitude logic module 310, which outputs the AM of the complex input signal. The input signal 302 is also applied to a delay element 248, which delays the natural complex signal 302 so that it is synchronised to the artificially generated pulse (such that the pulse is inserted onto of the naturally occurring peak). The output from the magnitude logic module 310 is input to a peak event detector logic module 312 arranged to detect peaks in the input signal.

The peak event detector logic module 312 may indicate when the natural AM signal is exhibiting a 'peak'. For example, if the AM value is considered as being a number between a '0' and a '1', then a rule employed by the peak event detector logic module 312 may be: if AM>0.7 then assume that a change in AM is positive and consequently that a Peak Event has occurred (e.g. on a positive or increasing AM signal whose value>0.7).

When the peak event detector logic module 312 detects a peak in the input signal, it outputs a pulse 318 used to trigger other potential events, and to a Squared Root Raised Cosine (SRRC) low pass filter (LPF) pulse response logic module 316. The SRRC LPF pulse response logic module 316 is arranged to filter out high frequency content, so that inserted pulse does not break spectral purity spec. The output from the SRRC pulse response logic module 316, together with a timing pulse from the peak event detector logic module 312 is input to a linear translation logic module 320 where the signal is an appropriately scaled pulse, so that the product of the natural pulse and the inserted (extended) pulse produces a peak of the desired extension.

Alternatively, a 'new' pulse, rather than an extension of a detected pulse, may be used.

The output from the linear translation logic module 320 is then input to a multiplication stage 304 where it is multiplied with the delayed version of the input signal 302. The output of the multiplication stage 304 is then delayed by further delay element 306 and provided to an input of the APD logic module (or in general the next stage in the transmitter chain), where the further delay element 306 may provide an extra variable adjustment to correct for timing and/or synchronisation errors. A control and timing logic 314 is provided and arranged to perform standard digital control and timing operations, as known to those skilled in the art.

Thus, a pulse insertion arrangement is disclosed that takes into account the channelisation Power-to-Average Ratio (PAR). For a UMTS system, the standard voice channel typically employs a PAR of approximately 3 dB, whilst data channels can have a much higher PAR value. An actual peak of 9 dB above the average is a rare event, but is statistically possible. Accordingly, the PA should be biased, for example using a forward-base programmable software register (not shown) so that the actual AM-AM compression is tuned for a target or specified level of peak extension in terms of PAR.

The sample pulse extension waveform 350 illustrates a simulated example of the individual pulses. The original AM waveform 352 is the output of the magnitude logic module 310; waveform 354 illustrates the output AM signal 308 from the pulse insertion system 300 and the waveform 356 illustrates the output signal from the linear translation logic module 320.

It should be noted that naturally occurring peaks may be examined to determine peak compression, instead of using the aforementioned (artificially injected) pulse insertion system. Here, it is envisaged, for example, that the naturally occurring peaks in an EDGE system would be adequate to examine the peak compression of the PA.

Figure 4:
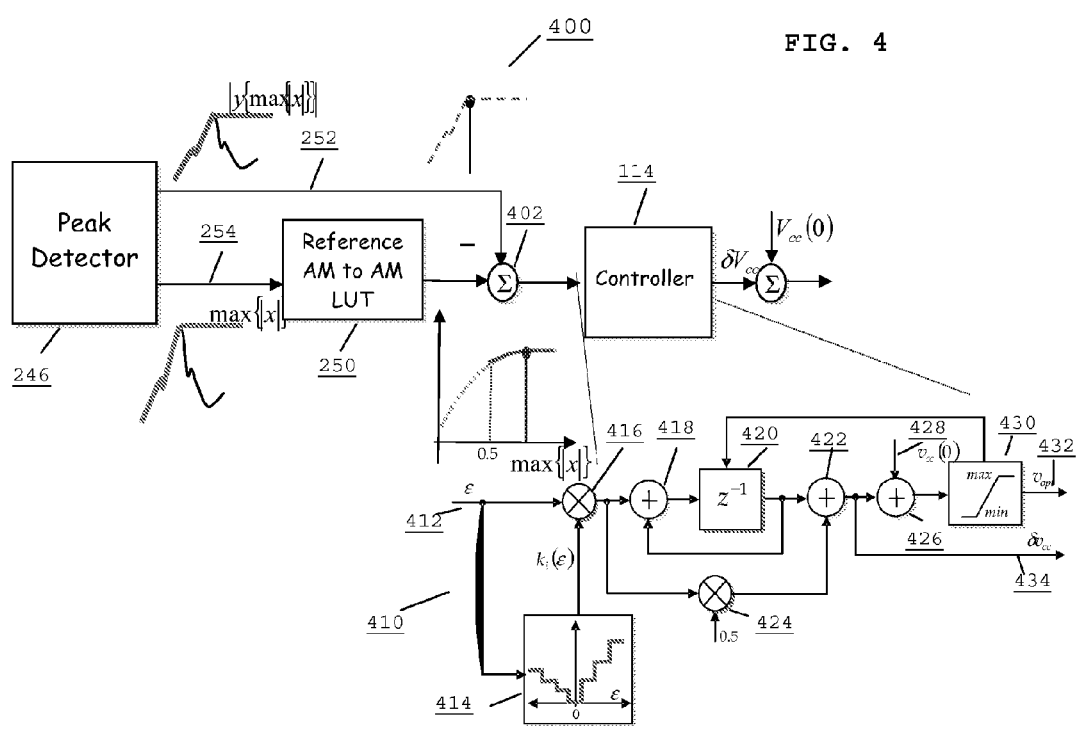
FIG. 4 illustrates a more detailed block diagram of an example of a detection, estimation and correction of the adaptive bias system of a wireless communication unit transmitter in accordance with embodiments of the invention.

Referring now to FIG. 4, a more detailed block diagram of the implementation of the controller logic module 114, is illustrated. In particular, controller logic module 114 is arranged to execute a method to calculate an adjustment to be made to bias the PA, for example PA 124 from FIG. 1, based on a determined error value between the measured peak output and the desired peak output (obtained from reference AM to AM look up table 250). The input to the controller logic module 114 is formed from the peak detector logic module 246 (of FIG. 2) that provides two output signals: a first signal 254 representative of the detected output AM level that corresponds to the peak input, $\max\{|x|\}$, 252, and a second signal 252 representative of the extended amplitude pulse 206 of FIG. 2. As mentioned, the second signal 252 representative of the extended amplitude pulse 206 is input to the reference AM to AM look up table 250. The first signal 254 is then subtracted in summing junction 402 from a desired AM-AM stored in the look-up table 250 to produce a signal representative of the deviation of the input signal from its desired AM-AM performance. The output from the summing junction 402 is input to controller logic module 124, which is shown in expanded form 410. The functional and logical operation of the controller logic module 124 may for example comprise a non-linear two-term Proportional+Integral (P+I) controller with maximum and minimum level limits. Based on a determined error value, a controller gain may be read from, say, a LUT 414. The error value may be determined from the read controller gain and then applied to a conventional P+I digital control algorithm to provide better convergence behaviour. Furthermore, the error value may provide larger correction steps when the error value is large, which for example, get progressively smaller to provide finer correction as the system converges. The output of the controller logic module 124 is then added to the current PA bias setting to produce a new bias setting. If the new PA bias setting value exceeds, for example, pre set values, it is adjusted to be limited to within these pre-set values. In this manner, the controller logic module 124 is arranged to adjust the PA supply voltage such that peak compression is regulated to a predetermined, desired level. Thus, the controller logic module 124 compares the measured AM-AM response to a desired AM-AM stored in the look-up table 250 and adjusts the PA supply voltage accordingly to minimise the AM error.

Figure 5:
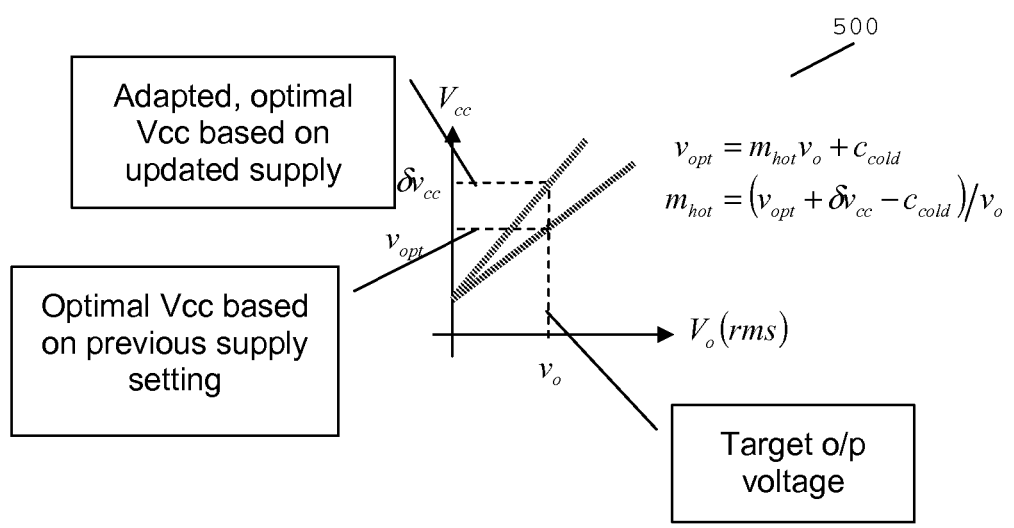
FIG. 5 illustrates a graphical representation of an adaptation of the output voltage (Vo) to supply voltage (Vcc) straight line relationship of a power amplifier of a wireless communication unit in accordance with an embodiment of the invention.

FIG. 5 illustrates a graphical representation 500 of an example of an adaptation of a calibration slope of Vo(rms) to Vcc, based on the adjusted power amplifier power control value of a power amplifier, say power amplifier 124, of a wireless communication unit. A change in the calibration slope may be tracked based on the correction performed by, say, the controller logic module 124 of FIG. 4. By tracking the slope it is possible to adjust the supply voltage setting (for example the bias voltage) Vcc for a given target output voltage Vo (measured in RMS). As shown, a straight line relationship exists between Vcc and Vo. For instance, controller logic module 114 may be arranged to calculate the change in Vcc ($\delta$Vcc) for the given target power. In response thereto, the controller logic module 114 is arranged to adapt (update) this straight line relationship based on the instantaneous adjustment by the controller logic module 114 as previously described. In accordance with one embodiment of the invention, the corrected optimal supply voltage may then be taken from the previous optimal value plus this delta; Vopt=Vopt+$\delta$Vcc. Referring to the straight line equation in FIG. 5, it is then possible to calculate a new slope (Mhot) of the straight line, given this corrected Vcc setting.

Notably, in this manner and in accordance with one embodiment of the invention, the closed loop correction to the supply, $\delta$Vcc, does not actually have to be applied at the instance that it is calculated. It is noted that the correction may be deferred to a time that is more appropriate; e.g. during the transition from one timeslot to another where the specifications may be more relaxed in terms of transient behaviour. For example, the correction of the supply may not be changed during a time period when it may degrade transient performance. Thus, the corrected value ($\delta$Vcc) is primarily used to update or adapt the slope, namely the Mhot variable. As the slope is tracked, in a form of the Mhot variable, it is possible to calculate the optimal Vcc for the upcoming power target. Thereafter, in accordance with one embodiment of the invention, it is that a saturation detection and correction algorithm is run, for example the saturation detection and correction algorithm of FIG. 6.

Hence, for a given target output voltage Vo (for example a target root-mean-square output power voltage), the controller logic module 114 is arranged to calculate what the required PA Vcc bias should be using simple straight line mathematical equations. Once the system converges, the loop can be turned off and the final state of the calibration slope may then be used for setting the optimal supply voltage Vcc given the target Vo.

Figure 6:
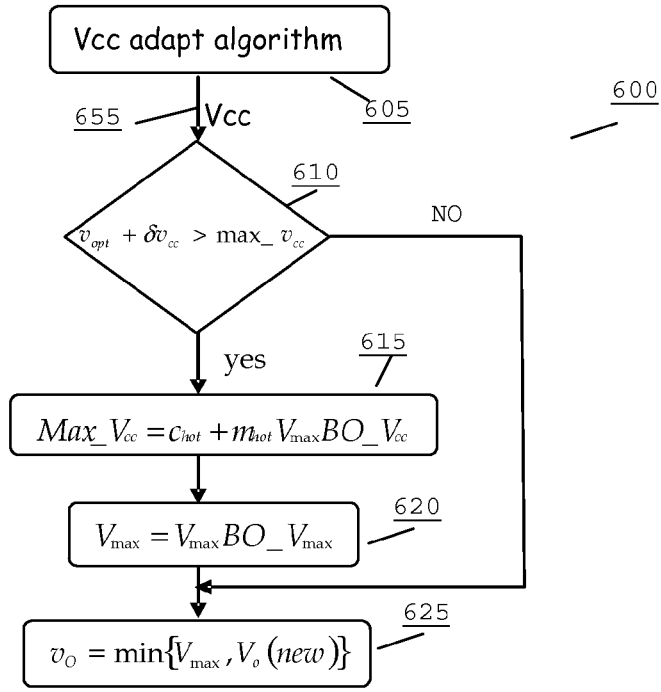
FIG. 6 illustrates a graphical representation and a flowchart of a saturation detection and correction process of a transmitter of a wireless communication unit in accordance with an embodiment of the invention.
Figure 6:
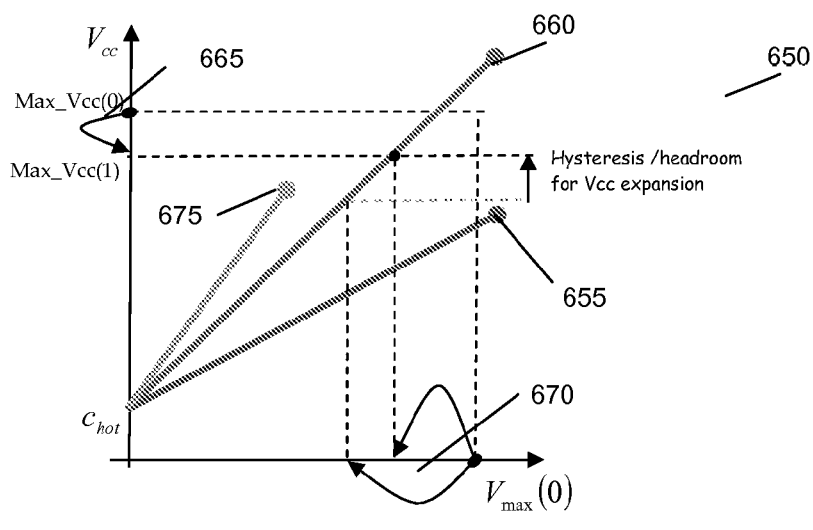

FIG. 6 illustrates a graphical representation 650 and a flowchart 600 of a saturation detection and correction of a transmitter of a wireless communication unit. The flowchart 600 of a saturation detection and correction algorithm may for example be employed by the controller logic module 114 of FIG. 1. In this manner, the saturation detection and correction may provide a further enhanced layer of smart technology using a straight line (and modifiable) relationship of supply voltage (Vcc) versus PA output voltage Vo(rms) to set a PA bias level for an upcoming power target.

The flowchart 600 commences with initialising of the PA power supply (Vcc) adaptation, in step 605, and an initial Vcc level is used 608, 655. A determination is then made, in step 610, as to whether the PA power supply exceeds a power supply threshold. If the PA power supply does not exceed a power supply threshold in step 610, the flowchart moves to step 625 where the output voltage of the saturation detection and controller logic module, say controller logic module 114 of FIG. 1, is set. If the PA power supply does exceed a power supply threshold 660 in step 610, then the Maximum Vcc level is reduced 665 to a suitable level in step 615. The Vmax level is also reduced 670, as shown in step 620. Thereafter, the saturation detection and correction system maintains the Vcc at a level 675 below the threshold level. In this manner, the saturation detection and correction system is able to automatically limit a target power to prevent the acknowledged problem of 'hard saturation'. If hard saturation is determined as occurring, the saturation detection and correction system may automatically back off the target power based on a linear relationship between the output voltage Vo(rms) and the PA power supply voltage Vcc, by employing the aforementioned slope adaptation algorithm 600. Thus, the Vcc adaptation & calibration algorithm uses the controller Vcc adjustments to update a Power target value according to a Vcc calibration curve. In this manner, the transmitter is able to prepare in advance the optimum supply setting for an upcoming power target request; otherwise the loop would only ever be able to react to past and present situations.

It will be understood that the wireless communication unit, integrated circuit and method of controlling an output power of a PA in a transmitter, as described above, tends to facilitate a radio transmitter to run deeper into compression, and hence more efficiently, regardless of process, load and/or temperature variation. In this manner, the radio transmitter is arranged to optimally bias a PA for both minimum current consumption and minimum nonlinearity, for example in a variable data rate 3G phone, across power target, process, temperature and load. This ultimately saves current consumption and thereby extends talk time for the radio transmitter. Furthermore, if an operating condition occurs that implies that the switcher voltage is too low, then the proposed invention is sufficiently intelligent to back off the target power. In addition, embodiments of the invention are less restrictive than known techniques in that they continuously operate a switcher loop, making its performance less susceptible to operating condition variations. Also, embodiments of the invention are more capable of being more aggressive in terms of operating the PA deeper in saturation, while maintaining good spectral performance.

In particular, at least one of the problems of the technique described in 'High Efficiency Power Amplifier Using Dynamic Power-Supply Voltage for CDMA Applications', authored by Hanington et al., and published in IEEE Trans on MTT vol. 47 no 8 Aug. 1999, (which suggests a rough lookup table method for updating the switcher voltage with respect to the target power, making it sensitive varying PA operating conditions) may be alleviated.

Those skilled in the art will realize that the above recognized advantages and other advantages described herein are merely exemplary and are not meant to be a complete rendering of all of the advantages of the various embodiments of the invention.

It will be appreciated that embodiments of the invention described herein may be comprised of one or more generic or specialized processors (or 'signal processors') such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and apparatus for performing power control described herein. Alternatively, some or all functions could be implemented by a state machine that has no stored program instructions, or in one or more application specific integrated circuits (ASICs), in which each function or some combinations of certain of the functions are implemented as custom logic circuitry. Of course, a combination of the two approaches could be used. Both the state machine and ASIC are considered herein as a 'signal processor' for purposes of the foregoing discussion and claim language.

Moreover, an embodiment of the invention can be implemented as a computer-readable storage element having computer readable code stored thereon for programming a computer (e.g., comprising a processing device) to perform a method as described and claimed herein. Examples of such computer-readable storage elements include, but are not limited to, a hard disk, a CD-ROM, an optical storage device, a magnetic storage device, a Read Only Memory (ROM), a Programmable Read Only Memory (PROM), an Erasable Programmable Read Only Memory (EPROM), an Electrically Erasable Programmable Read Only Memory (EEPROM) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

In the foregoing specification, specific embodiments of the invention have been described. However, one of ordinary skill in the art appreciates that various modifications and changes can be made without departing from the scope of the invention as set forth in the claims below.

Accordingly, the specification and figures are to be regarded in an illustrative rather than a restrictive sense, and all such modifications are intended to be included within the scope of invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Moreover in this document, relational terms such as first and second, top and bottom, and the like may be used solely to distinguish one entity or action from another entity or action without necessarily requiring or implying any actual such relationship or order between such entities or actions.

The terms 'comprises', 'comprising', 'has', 'having', 'includes', 'including', 'contains', 'containing' or any other variation thereof, are intended to cover a non-exclusive inclusion, such that a process, method, article, or apparatus that comprises, has, includes, contains a list of elements does not include only those elements, but may include other elements not expressly listed or inherent to such process, method, article, or apparatus. An element proceeded by 'comprises . . . a', 'has . . . a', 'includes . . . a', 'contains . . . a' does not, without more constraints, preclude the existence of additional identical elements in the process, method, article, or apparatus that comprises, has, includes, contains the element. The terms 'a' and 'an' are defined as one or more, unless explicitly stated otherwise herein.

The terms 'substantially', 'essentially', 'approximately', 'about' or any other version thereof, are defined as being close to as understood by one of ordinary skill in the art. The term 'coupled' as used herein is defined as connected, although not necessarily directly and not necessarily mechanically. A device or structure that is 'configured' in a certain way is configured in at least that way, but may also be configured in ways that are not listed.

The invention claimed is:

1. A wireless communication unit comprising a transmitter having a forward path comprising a power amplifier, PA, and a feedback path operably coupled to the power amplifier, wherein the feedback path comprises a coupler arranged to feed back a portion of a signal to be transmitted and a controller logic module arranged to control a power control value of the power amplifier, such that the forward path and feedback path form a closed loop power control,
wherein the feedback path further comprises a peak detector logic module operably coupled to the controller logic module and power amplifier and arranged to identify a level of peak PA compression in a fed back signal, wherein in response to the identified level of peak PA compression the controller logic module is arranged to automatically adjust a power amplifier power control value of the PA to obtain a predetermined level of peak PA compression.

2. The wireless communication unit of claim 1 further comprising a pulse extension logic module arranged to extend at least one identified pulse of a transmit signal such that the peak detector logic module identifies a level of peak PA compression applied to the extended pulse.

3. The wireless communication unit of claim 1 wherein the controller logic module is arranged to automatically adjust a power amplifier power control value of the PA in response to an identified naturally occurring level of peak PA compression in the transmit signal based on a modulation scheme being used.

4. The wireless communication unit of claim 1 further comprising a memory element arranged to store at least one desired peak response such that the controller logic module is arranged to compare the identified peak response to a stored desired peak response and automatically adjust the power amplifier power control value of the PA in response to the comparison.

5. The wireless communication unit of claim 1 wherein the controller logic module is further arranged to adapt a calibration slope of output voltage to supply voltage, to automatically adjust the power amplifier power control value of the PA.

6. The wireless communication unit of claim 1 wherein the feedback path further comprises a detector operably coupled to the controller logic module arranged to identify when saturation of a PA output signal occurs based on the identified level of peak PA compression in a fed back signal, such that the controller logic module is further arranged to automatically limit a target output power of the power amplifier in response to a detection of PA saturation.

7. The wireless communication unit of claim 1 wherein the power amplifier power control value comprises at least one from a group of: a power amplifier supply voltage, a power amplifier bias voltage level.

8. The wireless communication unit of claim 7 wherein the controller logic module is arranged to regulate amplitude modulation (AM) to AM power amplifier distortion based on an adjusted power amplifier supply voltage.

9. An integrated circuit for performing power control of a transmitter comprising a power amplifier, PA, the integrated circuit comprising a forward path and a feedback path operably coupleable to the PA, wherein the feedback path comprises a controller logic module arranged to control a power control value of the power amplifier, such that the forward path and feedback path form a closed loop power control,
wherein the feedback path further comprises a peak detector logic module operably coupled to the controller logic module and arranged to identify a level of peak PA compression in a fed back signal, wherein in response to the identified level of peak PA compression the controller logic module is arranged to automatically adjust a power amplifier power control value to be applied to the PA to obtain a predetermined level of peak PA compression.

10. The integrated circuit of claim 9 further comprising:
a pulse extension logic module arranged to extend at least one identified pulse of a transmit signal such that the peak detector logic module identifies a level of peak PA compression applied to the extended pulse.

11. The integrated circuit of claim 9 wherein the controller logic module is arranged to regulate amplitude modulation (AM) to AM power amplifier distortion based on an adjusted power amplifier supply voltage.

12. A method of power control in a wireless communication unit comprising a transmitter having a forward path comprising a power amplifier, PA, and a feedback path operably coupled to the PA and comprising a controller logic module arranged to control a power control value of the power amplifier, such that the forward path and feedback path form a closed loop power control,
wherein the method comprises:
identifying a level of peak PA compression in a fed back signal from the PA, and
automatically adjusting a power amplifier power control value of the PA in response to the identified level of peak PA compression to obtain a predetermined level of peak PA compression.

13. A computer-readable storage element having computer readable code stored thereon, said computer readable code comprising instructions to perform a method as claimed in claim 12 capable of being executed by a computer.

14. The method of claim 12 further comprising:
extending at least one identified pulse of a transmit signal; and
identifying a level of peak PA compression applied to the extended pulse.

15. The method of claim 12 wherein the automatically adjusting the power amplifier power control value of the PA comprises:
automatically adjusting the power amplifier power control value of the PA in response to an identified naturally occurring level of peak PA compression in the transmit signal based on a modulation scheme being used.

16. The method of claim 12 further comprising:
storing at least one desired peak response;
comparing the identified peak response to a stored desired peak response, wherein the automatically adjusting the power amplifier power control value of the PA comprises:
automatically adjusting the power amplifier power control value of the PA in response to the comparison.

17. The method of claim 12 wherein the automatically adjusting the power amplifier power control value of the PA comprises:
  adapting a calibration slope of output voltage to supply voltage, to automatically adjust the power amplifier power control value of the PA.

18. The method of claim 12 further comprising:
  identifying when saturation of a PA output signal occurs based on the identified level of peak PA compression in a fed back signal; and
  automatically limiting a target output power of the power amplifier in response to a detection of PA saturation.

19. The method of claim 12 wherein the power amplifier power control value comprises at least one from a group of: a power amplifier supply voltage, a power amplifier bias voltage level.

20. The method of claim 12 further comprising:
  regulating amplitude modulation (AM) to AM power amplifier distortion based on an adjusted power amplifier supply voltage.

* * * * *